United States Patent [19]

Henry et al.

[11] Patent Number: 5,325,129
[45] Date of Patent: Jun. 28, 1994

[54] MILLIMETER WAVELENGTH ENERGY DETECTOR PIXEL HAVING INTERMEDIATE FREQUENCY AMPLIFICATION

[75] Inventors: Howell G. Henry, Baltimore; Russell R. Shaller, Brooklyn Park; Ronald G. Freitag; Marvin Cohn, both of Baltimore; David A. Blackwell, Jessup; James E. Degenford, Dayton, all of Md.

[73] Assignee: Westinghouse Electric Corporation, Pittsburgh, Pa.

[21] Appl. No.: 72,388

[22] Filed: Jun. 7, 1993

[51] Int. Cl.⁵ .............................................. H04N 5/44
[52] U.S. Cl. .................................. 348/571; 455/327; 250/332; 348/162
[58] Field of Search ....................... 358/188, 110, 113; 455/327, 330; 257/428; 250/332; H04N 5/44

[56] References Cited

U.S. PATENT DOCUMENTS

| | | | |
|---|---|---|---|
| 4,099,228 | 7/1978 | Cohn | 363/159 |
| 4,142,198 | 2/1979 | Finnila et al. | 357/24 |
| 4,190,851 | 2/1980 | Finnila et al. | 357/30 |
| 4,197,553 | 4/1980 | Finnila et al. | 357/30 |
| 4,213,137 | 7/1980 | Pines | 357/30 |
| 4,257,057 | 3/1981 | Cheung et al. | 357/24 |
| 4,400,729 | 8/1983 | Jones | 358/113 |
| 4,659,928 | 4/1987 | Teu | 250/332 |
| 4,924,285 | 5/1990 | Anderson et al. | 357/30 |
| 4,980,925 | 12/1990 | Blustine et al. | 455/327 |
| 4,993,032 | 2/1991 | Bradley | 372/20 |
| 5,021,663 | 6/1991 | Hornbeck | 250/349 |
| 5,023,455 | 6/1991 | Vanstraelen | 250/370 |
| 5,127,102 | 6/1992 | Russell | 455/327 |
| 5,142,698 | 8/1992 | Koga et al. | 455/327 |
| 5,224,218 | 6/1993 | Shiga | 455/327 |

OTHER PUBLICATIONS

H. G. Henry, R. G. Freitag, R. R. Shaller and M. Cohn, "A GaAs Monolithic Array of Impedance Matched Antenna/Detector Pixels For a 94 Ghz Imaging System," 1989 IEEE International Electron Devices, Meeting, Washington, D.C., Dec. 3-6, 1989, *Technical Digest*, pp. 181-184.

*Primary Examiner*—Mark R. Powell
*Assistant Examiner*—Jeffrey S. Murrell

[57] ABSTRACT

The present invention provides a monolithic superheterodyne detector pixel operable to receive a radio frequency (RF) signal at millimeter wavelength and produce a video output signal with many orders of improved sensitivity when compared with the prior art. This sensitivity improvement is achieved by translating the received RF signal to a intermediate frequency (IF) signal before detection of the video signal. At the lower frequency of the IF signal, monolithic amplification circuitry can be fabricated more easily to provide necessary gain than would be achievable if simple amplification of the RF signal were attempted. Detector pixels constructed in accordance with the invention each contain an antenna for receiving the RF signal. Local oscillator (LO) signal circuitry likewise apply an externally generated LO signal to the pixel. The RF signal and LO signal are then applied by interconnecting conductors to appropriate mixer means to produce the IF signal. An IF amplifier next amplifies the IF signal to a level sufficient for detection of the video output signal by a second detector. In presently preferred embodiments, pixel circuitry is fabricated in microstrip format with impedance matching provided between respective monolithic components. The antenna and local oscillator signal circuitry may each comprise slots defined in the metallized ground plane of the detector substrate. Utilization of a subharmonic mixer permits the external LO signal to be a subharmonic of the "virtual LO" mixed with the received RF signal. The amplifier may comprise a plurality of cascaded field effect transistor (FET) amplifier stages. The second detector, as well as diodes utilized in the mixer, are preferably Schottky barrier diodes.

12 Claims, 4 Drawing Sheets

MILLIMETER WAVELENGTH ENERGY DETECTOR PIXEL HAVING INTERMEDIATE FREQUENCY AMPLIFICATION

BACKGROUND OF THE INVENTION

1. Field of the Invention

The present invention generally relates to arrays of radiation sensitive elements used in imaging systems and the like. More particularly, the invention relates to a monolithic superheterodyne detector pixel usable in such an array to receive a radio frequency signal at millimeter wavelength and produce a video output signal.

2. Description of the Prior Art

Focal plane arrays used in radiation imaging systems systems frequently contain over 100,000 pixel elements. Typically, such systems detect radiation occurring in the visible and infrared regions. There has long been a interest in developing focal plane arrays usable at millimeter wavelengths because of the ability of energy in this band to penetrate fog, snow, moderate rain and many visibly opaque materials. Unfortunately, with the technology previously available, it was not practical to implement a system usable at these frequencies which contained a large number of pixel elements. Recently, however, some of the inventors of this invention have demonstrated that a monolithic detector pixel may be constructed capable of detecting 94 GHz energy with tangential signal sensitivity (TSS) of better than −50 dBm (decibels relative to a milliwatt).

Such pixels, which can be incorporated into a much larger array of similar pixels, were constructed having a slot antenna defined in a metallized ground plane of GaAs substrate. A microstrip circuit containing a Schottky-barrier detector diode was fabricated on the substrate face opposite the ground plane. The microstrip circuit was configured to provide an optimum impedance match between the diode and the slot antenna. As a result, it was not necessary to effect tuning to free space utilizing external impedance matching elements as had previously been required. Such external impedance matching elements are undesirable because they add significant overall size to each pixel. The findings concerning this pixel were fully reported in the following article which is incorporated herein by reference: H. G. Henry, R. G. Freitag, R. R. Shaller, and M. Cohn, "A GaAs Monolithic Array of Impedance Matched Antenna/Detector Pixels For A 94 GHz Imaging System," presented at the 1989 IEEE International Electron Devices Meeting, Washington, DC, Dec. 3-6, 1989, *Technical Digest*, pp. 181-184.

In many applications, a much greater sensitivity than that achievable with simple video detection is required. In a radiometric mode for which a detected video bandwidth of 1 MHz is desired, a reasonable FkTB (where: F is a channel noise contribution (in dB), k is the Boltzmann constant, T is absolute temperature, and B is desired video bandwidth) figure would be approximately −104 dBm. This is significantly less than the −50 dBm sensitivity achievable with the state-of-the-art 94 GHz pixel described above. In other words, more than 60 dB of preamplification gain would be required in the received signal prior to detection. At such high frequencies, however, it is difficult to fabricate monolithic amplifiers having sufficient yield or reliability.

SUMMARY OF THE INVENTION

The present invention provides a monolithic detector pixel operable to receive a radio frequency (RF) signal at millimeter wavelength and produce a video output signal. A sensitivity improvement over the prior art is achieved by translating the received RF signal to a intermediate frequency (IF) signal before detection of the video signal. At the lower frequency of the IF signal, monolithic amplification circuitry to provide necessary gain can be fabricated more easily than would be achievable if simple amplification of the RF signal were attempted.

Detector pixels constructed in accordance with the invention each contain antenna means for receiving the RF signal. Local oscillator (LO) signal means likewise apply an externally generated LO signal to the pixel. The RF signal and LO signal are then applied by interconnecting conductor means to appropriate mixer means to produce the IF signal. IF amplifier means next amplify the IF signal to a level sufficient for second detector means to detect the video output signal.

In presently preferred embodiments, pixel circuitry is fabricated in microstrip format with impedance matching provided between respective monolithic components. The antenna means and local oscillator signal means may each comprise slots defined in the metallized ground plane of the detector substrate. Utilization of a subharmonic mixer permits the external LO signal to be a subharmonic of the "virtual LO" mixed with the received RF signal. The amplifier means may comprise a plurality of cascaded field effect transistor (FET) amplifier stages. The second detector means, as well as diodes utilized in the mixer, are preferably Schottky barrier diodes.

DETAILED DESCRIPTION OF PRESENTLY PREFERRED EMBODIMENTS

In accordance with the present invention, a detector pixel may be provided which effectively detects millimeter wavelength electromagnetic radiation with greater sensitivity than the prior art. Because of their greater sensitivity, pixels of the invention may be incorporated into a focal plane array system or the like operative in either an active (e.g., illuminated) or passive (e.g., radiometric) mode. Detection at millimeter wavelengths may be advantageous in a number of desirable practical applications, such as aircraft landing systems and airborne surface mapping systems. As is used herein, the term "millimeter wavelength" generally refers to a range of frequencies within the band of 30 GHz to 300 GHz. Due to an atmospheric "window" which appears to radiant energy at approximately 94 GHz (approximately 3.2 mm wavelength), it is contemplated that many embodiments of the invention will operate in this frequency region.

Figure 1:
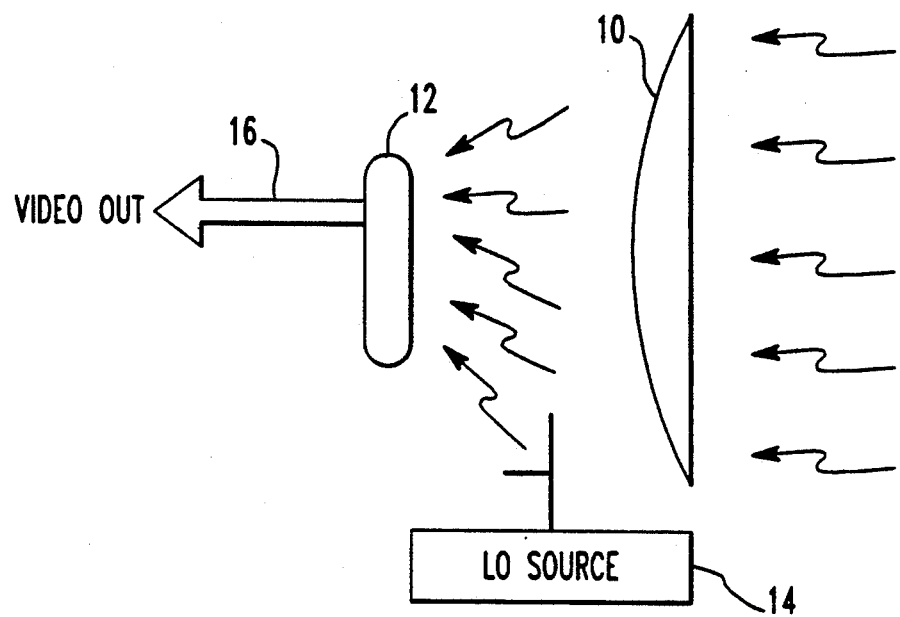
FIG. 1 is a diagrammatic representation of a focal plane array system utilizing a multiplicity of detector pixels constructed in accordance with the present invention.

FIG. 1 illustrates a focal plane array system incorporating a multiplicity of detector pixels constructed in accordance with the invention. As illustrated by the arrows, ambient electromagnetic energy containing desired signal information is first received by an appropriate collecting aperture, such as a parabolic reflector or, as illustrated, a converging lens 10. An array 12 containing a multiplicity of detector pixels constructed in accordance with the invention is situated in the focal plane of, in this case, lens 10. As the energy passes through lens 10, it is directed towards respective pixels of array 12. Each pixel corresponds to a different angle of arrival of the incident electromagnetic energy. The respective pixels are preferably spaced according to the F/D (focal length per aperture dimension) ratio multiplied by the wavelength. Thus, in a 94 GHz system with F/D=2, pixels may be placed approximately 6.4 mm apart.

An external local oscillator (LO) source 14 supplies an LO signal to respective pixels of array 12. While LO source 14 is illustrated supplying the LO signal by illumination, it may be desirable in many applications to supply LO signal to each pixel via a surface mounted manifold or the like located on array 12. After receiving the LO signal and the desired ambient electromagnetic energy at RF, the respective pixels of array 12 produce video output signal referenced collectively as video output 16.

Figure 2:
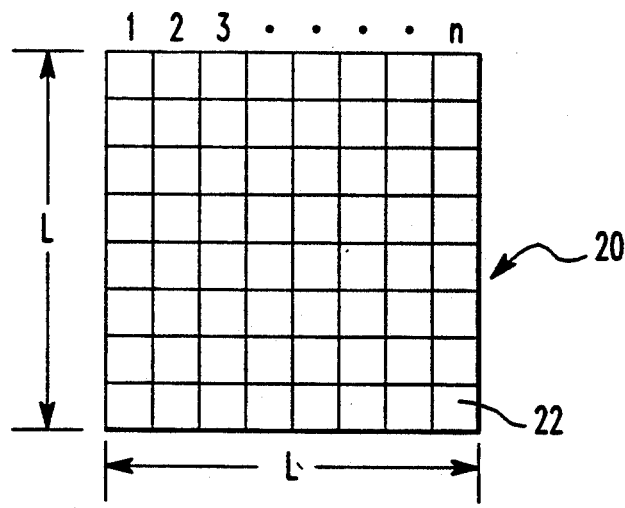
FIG. 2 is a diagrammatic representation of a semiconductor having a plurality of monolithically fabricated detector pixels constructed in accordance with the invention.

In presently preferred embodiments, it is contemplated that array 12 will be constructed of a plurality of "tiles" placed side-by-side. A tile is simply a single semiconductor substrate chip, such as 0.004" GaAs, in which a plurality of detector pixels have been replicated. Typically, such a tile will be a "sweet spot" carved from a larger semiconductor wafer. FIG. 2 illustrates such a tile 20 in the form of a square having dimensions L by L, where L is a chosen base length. Respective pixels, such as pixel 22, of tile 20 are diagrammatically represented as smaller blocks within an overall grid-like arrangement. Assuming a number N of pixels in each planar dimension L, the total number of pixels on tile 20 would be N by N. In presently preferred embodiments, a typical value of the dimension L may be one inch. In this case, a number N of eight pixels could be successfully fabricated, giving a total of 64 pixels in a one square inch tile.

Figure 3:
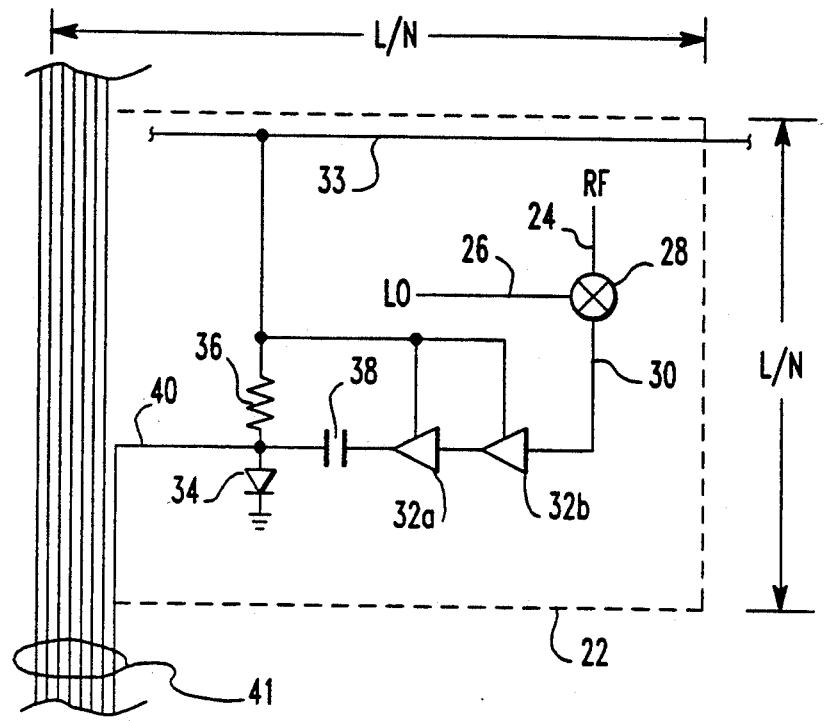
FIG. 3 is a schematic diagram illustrating circuit elements which may be contained on a single detector pixel taken from the tile of FIG. 2.

The circuitry utilized by each detector pixel to produce a video output signal is monolithically fabricated on the semiconductor substrate. FIG. 3 schematically illustrates such circuitry formed on representative pixel 22. As shown, the RF signal is applied to conductor 24 on the front face of pixel 22 by an appropriate antenna. Similarly, the LO signal is applied to conductor 26. Conductors 24 and 26 then supply the respective RF and LO signals to mixer 28. Mixer 28 produces on conductor 30 an intermediate frequency ("IF") signal.

Because the IF signal may be of an insufficient level for the desired video information to be directly detected, it is amplified prior to second detection. To facilitate this amplification, the frequency of the IF signal should be chosen such that monolithic amplifiers can be effectively and economically fabricated on the semiconductor substrate. Utilizing known techniques, amplifiers operable in the lower GHz range can be easily fabricated. Thus, for example, an IF signal frequency of 2.5 GHz is believed suitable. To produce a difference frequency IF signal at 2.5 GHz assuming an RF signal frequency of 94 GHz requires mixing with a signal of 91.5 GHz. Because LO sources at this frequency are frequently unreliable and unstable, it is preferable that mixer 28 be a harmonic mixer. A harmonic mixer functions to mix the RF signal with a multiple of the applied LO signal. This multiple is referred to the "virtual" LO signal. In the above example wherein mixing with a virtual LO of 91.5 GHz is desired, the external LO source may provide a signal at one-half this frequency, or 45.75 GHz.

Because as much as 60 dB of amplification of the IF signal will often be necessary, a number of cascaded amplifier sections will generally be provided. While two such amplifier sections 32a and 32b are illustrated, it is generally believed that each pixel will contain four or five such sections in cascade. Bias voltage for pixel circuit elements such as amplifier sections 32a-b is provided by bias line 33.

After amplification, the IF signal is applied to the second detector to detect the video information. In presently preferred embodiments, the second detector comprises a diode 34 forward biased by dropping resistor 36 for square law operation. Capacitor 38 provides DC blocking between diode 34 and amplifier sections 32a-b. Diode 34 removes the modulation envelope of the IF signal and produces a video output signal on line 40. Line 40, along with other pixel output lines collectively referenced as 41, extend off the tile for further processing as desired.

Specific details of the various components which may appear on pixel 22 will be discussed with reference to FIGS. 4 through 6. Referring particularly FIG. 4, a schematic of a presently preferred configuration for mixer 28 is illustrated. This configuration utilizes as its primary mixing component an antiparallel diode pair 42 having respective diodes 42a and 42b. Generally, there are two ways of designing a harmonic mixer. The conventional method is to use a single diode to which a composite waveform consisting of the RF signal and LO signal is applied. The conversion loss obtained by harmonic mixing with a single diode has typically been 3-5 dB greater than that which could be attained by fundamental mixing at the same signal frequency. Analysis shows that such degradation should not exist, but it assumes that fundamental mixing between the RF signal and the LO signal is suppressed. Fundamental mixing will, however, take place unless the harmonic mixer provides a reactive termination for these mixer product which is generally difficult to do at millimeter wavelengths. Using antiparallel diode pair 42 overcomes some of the deficiencies of a single diode design.

The advantages of an antiparallel diode pair such as diode pair 42 are fully described in U.S. Pat. No. 4,099,228, issued Jul. 4, 1978 to Marvin Cohn, incorporated herein by reference. As discussed in that patent, application of a voltage waveform:

$$V = V_{LO} \sin \omega_{LO} t + V_{RF} \sin \omega_{RF} t$$

to the asymmetric diode characteristic of a conventional single diode mixer results in the diode current having all frequencies $mF_{LO} \pm nF_{RF}$. On the other hand, the total current of an antiparallel diode pair such as that shown in FIG. 4 contains only frequencies for which m+n is odd. In other words, even harmonics, fundamental mixing products and the DC circulate only within the diode loop.

Figure 4:
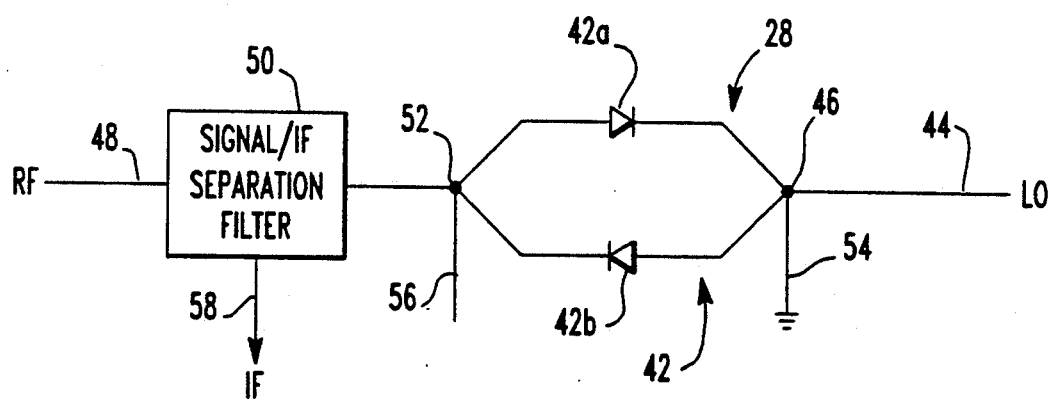
FIG. 4 is a schematic diagram of a harmonic mixer utilized in presently preferred embodiments of the FIG. 4A is a spectral plot illustrating mixing characteristics of an antiparallel diode pair such as that schematically illustrated in FIG. 4.
Figure 4A:
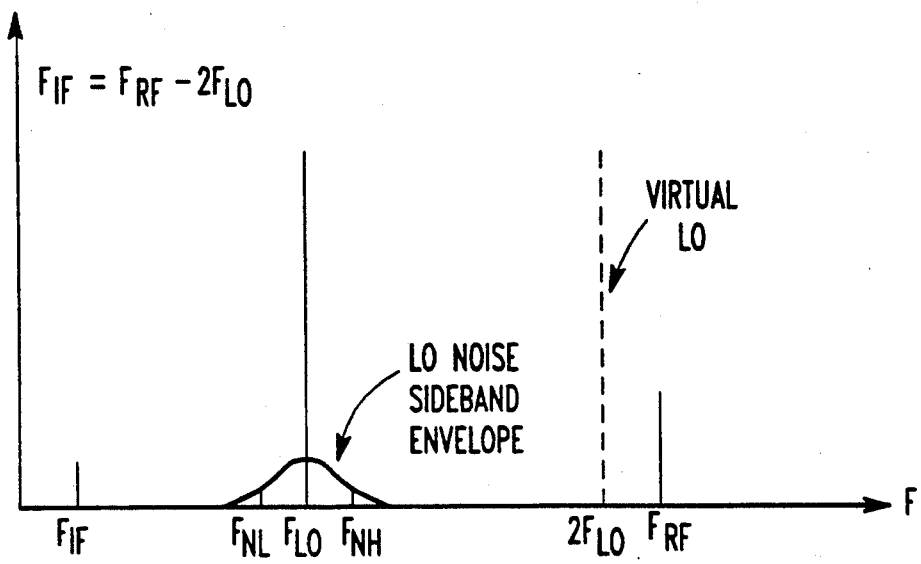
FIG. 4B is a plan view of a microstrip realization of the harmonic mixer illustrated in FIG. 4.

As seen in FIG. 4A, the degradation of receiver noise due to LO noise sidebands is also reduced in even harmonic mixing (i.e., m is even, n=1) in an antiparallel diode pair. LO noise bands ($F_{NL}$ and $F_{NH}$) whose separation from the LO signal ($F_{LO}$) equals $F_{IF}$ generate IF noise which only circulates within the diode loop when they mix fundamentally with the LO signal. Second harmonic mixing of these noise sidebands with the virtual LO signal ($2F_{LO}$) produces noise which is not within the passband of the IF amplifier. Like a conventional balanced mixer, of course, the degree of suppression is affected by the balance between diodes.

Referring again to FIG. 4, the LO signal is applied on input line 44 which is connected to a first terminal 46 of antiparallel diode pair 42. The RF signal is applied to mixer 28 on input line 48. The RF signal then passes through a signal/IF separation filter 50 and is applied to a second terminal 52 of the antiparallel diode pair 42. A short circuit stub 54 is connected to first terminal 46. An open circuit stub 56 is likewise connected to second terminal 52. The length of stubs 54 and 56 is approximately one-fourth the wavelength of the LO signal and one-half wavelength of the RF signal. As a result, a high shunt impedance point for the LO signal is provided at first terminal 46 permitting the LO signal to reach the diodes, while a low impedance point is provided for the RF signal that has flowed through diodes. Similarly, a high shunt impedance point for the RF signal is produced at second terminal 52 permitting the RF signal to reach the diodes, while a low impedance point for the LO signal that has flowed through the diodes is also produced. The IF signal, produced at second terminal 52, is fed to separation filter 50 and is output from mixer 28 on output line 58.

Figure 4B:
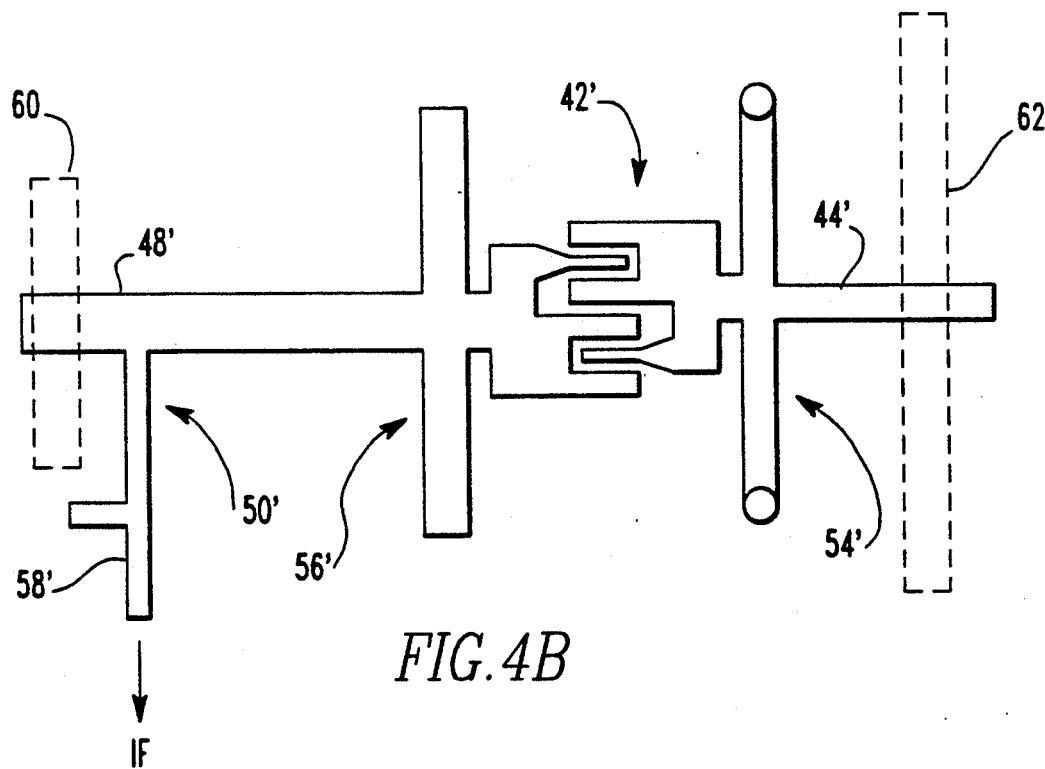

FIG. 4B illustrates the mixer of FIG. 4 as it may actually appear in microstrip format. Like elements have been given where possible the same reference number followed by a prime (apostrophe) designator. Of particular significance are the slots 60 and 62 shown in phantom which are defined in the ground plane face of the semiconductor substrate opposite the face onto which the microstrip circuit has been deposited. The slots are configured having a length approximately one half the free space wavelength of the desired incident signal. Thus, because slot 62 is receiving the external LO signal, its length is greater than slot 60 which is receiving the higher frequency RF signal. While slot antennas have been illustrated, other antenna configurations, such as dipole or patch antennas, may be preferable in some applications. As can be seen, shorting of the respective ends of stub 54' may be accomplished by grounding vias, i.e., conductive posts extending through the semiconductor substrate to the metallized ground plane below.

To ensure maximum power transfer, elements of the pixel circuit are configured to provide an impedance match with slots 60 and 62. In other words, the lengths and characteristic impedances of the microstrip should be adjusted to approximate complex conjugates on both sides of any point in the circuit. For example, in FIG. 4B, the lengths and characteristic impedance of conductors 44' and 48' may be adjusted. Also, the length and characteristic impedance of microstrip outboard of slots 60 and 62 may also be adjusted.

Figure 5:
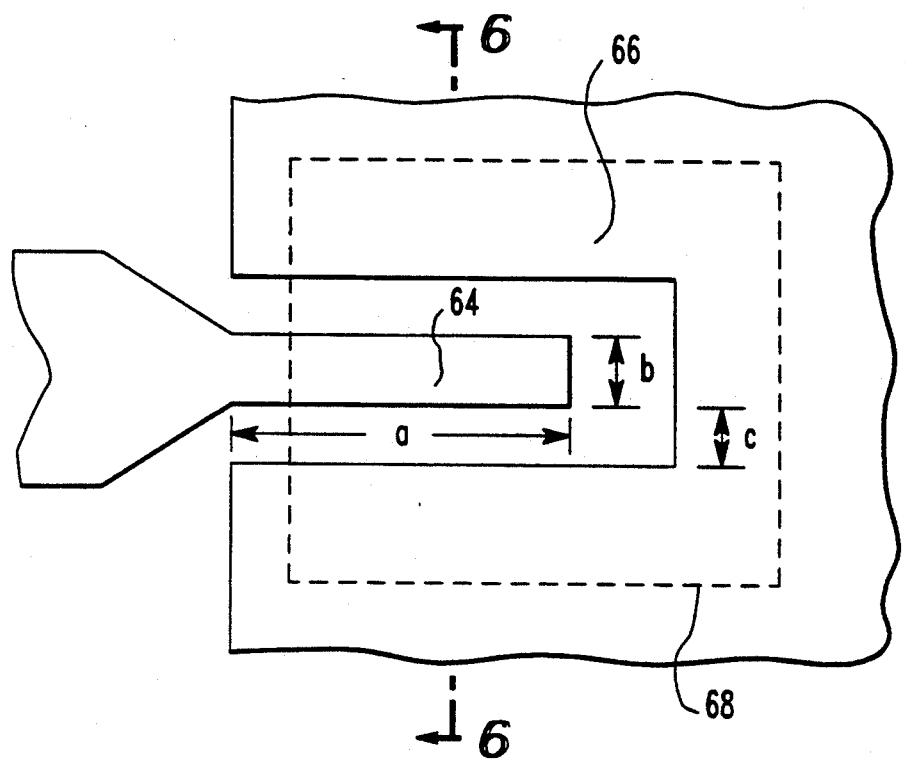
FIG. 5 is a plan view of a surface oriented Schottky barrier diode utilized in presently preferred embodiments of the invention.

Mixer diodes 42a and 42b as well as second detector diode 34 are preferably surface oriented Schottky barrier (SB) diodes, such as that illustrated in FIG. 5. The anode 64 of this SB diode is a metallized stripe extending along the surface of the semiconductor substrate. Metallized cathode 66 is spaced apart from anode 64 on the surface of the semiconductor substrate and surrounds anode 60 on three sides. The size of such a diode may be appreciated by the following typical dimensions: (1) anode length "a" equals approximately ten microns; (2) anode width "b" equals approximately one micron; and (3) gap "c" between anode metallization and cathode metallization equals approximately one micrometer.

Figure 6:
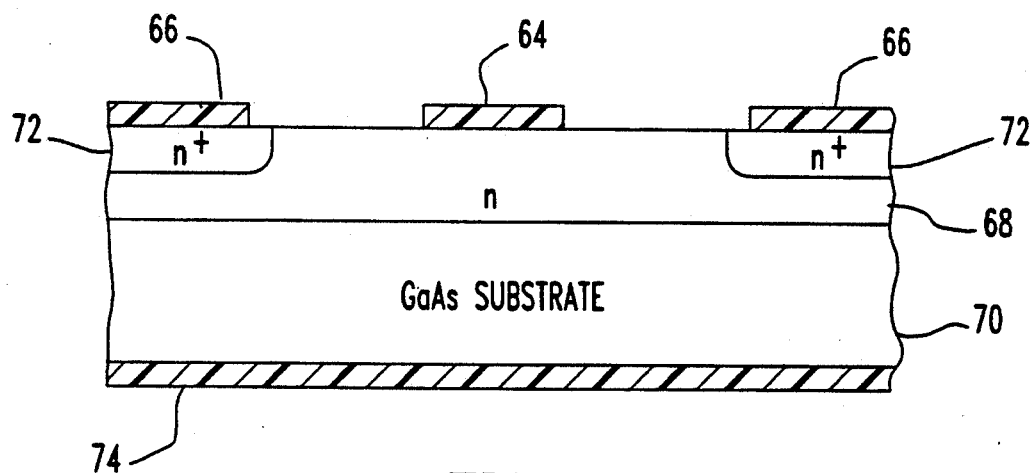
FIG. 6 is a sectional view taken along lines 6—6 of FIG. 5 illustrating the semiconductor substrate and selected doping levels therein to form the surface oriented Schottky barrier diode.

FIG. 6 illustrates the additional details of the diode shown in FIG. 5. As can be seen, an active region 68 preferably having a carrier concentration n equal to approximately $1-1.5 \times 10^{17}$ cm$^{-3}$ is formed in tile substrate 70. Anode contact 64 thus forms a Schottky barrier at the metal-semiconductor interface. The diode ohmic contacts are formed by heavily doped n+ region 72 below cathode metallization 66. Also shown in FIG. 6 is the metallized ground plane 74 on the back face of substrate 70.

The IF amplifier, 32a and 32b of FIG. 3, is preferably a conventional low noise multistage FET MMIC device. The fabrication of such an amplifier on GaAs is compatible with fabrication of Schottky barrier diodes preferably used for the mixer and second detector. The FETS and diodes have similar carrier concentration profiles and dimensional tolerances. To permit the respective amplifier sections to operate with only one voltage supply, e.g., drain bias, the amplifier gates may be of self bias design (emitter resistors). This further facilitates small pixel size.

While pixels for operation in a passive or an active mode are generally similar, several important operational differences exist which may influence design considerations in certain applications. For example, a passive mode system should have a wide IF bandwidth in order to maximize sensitivity. Additionally, it is desirable that a passive mode system receive RF signals in two channels, i.e., RF equals LO+IF and LO−IF. This increases received energy without generally increasing noise contributions of circuitry on the pixel. By virtue of this double channel operation, the mixer and antenna must have a larger bandwidth, e.g. 4 GHz at 94 GHz in the exemplar discussed above. At high millimeter wavelength frequencies, however, this bandwidth is a relatively small percentage of center frequency. Thus, the mixer and slot coupling will generally be capable of accommodating this bandwidth.

The increased IF bandwidth may lead to gain equalization problems in the amplifier stages. Fortunately, at low IF frequencies, feedback is an effective tool which can be used to provide this equalization. Feedback may also offer improved input and output matches to further simplify the design.

It can thus be seen that the invention provides a monolithic detector pixel usable in a focal plane array or the like to receive millimeter wavelength electromagnetic radiation and produce a video output signal with greater sensitivity than the prior art. While a presently preferred embodiment of the invention has been described and illustrated, it is to be distinctly understood that the invention is not limited thereto but may be otherwise variously embodied and practiced within the scope of the following claims.

We claim:

1. A monolithic detector pixel formed on a semiconductor substrate and operable to receive a radio frequency signal of millimeter wavelength electromagnetic energy and produce a video output signal, said pixel comprising:
    antenna means for receiving said radio frequency signal;
    local oscillator signal means for applying an externally generated local oscillator signal to said pixel;
    mixer means for receiving said radio frequency signal and said local oscillator signal and producing an intermediate frequency signal;
    interconnecting conductor means for supplying said radio frequency signal from said antenna means to said mixer means;
    said interconnecting conductor means further for supplying said local oscillator signal from said local oscillator signal means to said mixer means;
    second detector means for receiving said intermediate frequency signal and producing said video output signal; and,
    intermediate frequency amplifier means electrically connected intermediate said mixer means and said second detector means for amplifying said intermediate frequency signal to a level sufficient to be detected by said second detector means.

2. The detector pixel of claim 1 wherein said antenna means comprises a slot defined in a metallized ground plane of said semiconducting substrate, said slot having a length generally equal to one-half a wavelength of said radio frequency signal.

3. The detector pixel of claim 1 wherein said interconnecting conductor means comprise microstrip conductors.

4. The detector pixel of claim 3 wherein said microstrip conductors are sized to generally provide an impedance match between said antenna means and said second detector means.

5. The detector pixel of claim 1 wherein said mixer means comprises a harmonic mixer operative to produce said intermediate frequency signal by mixing a harmonic of said local oscillator signal with said radio frequency signal.

6. The detector pixel of claim 5 wherein said harmonic mixer comprises a pair of anti-parallel Schottky barrier diodes.

7. The detector pixel of claim 1 wherein said second detector means comprises a Schottky barrier detector diode.

8. The detector pixel of claim 7 wherein said mixer means is a harmonic mixer comprising a pair of anti-parallel Schottky barrier diodes.

9. The detector pixel of claim 1 wherein said amplifier means comprises a plurality of cascaded amplifier stages.

10. A tile usable along with a plurality of similar tiles in a focal plane array for detection of electromagnetic radiation, said tile comprising:
    a semiconductor substrate chip having thereon a plurality of monolithic superheterodyne detector pixels;
    each said monolithic superheterodyne detector pixels including:
    (a) antenna means for receiving a radio frequency signal;
    (b) local oscillator signal means for applying an externally generated local oscillator signal to said pixel;
    (c) mixer means for receiving said radio frequency signal and said local oscillator signal and producing an intermediate frequency signal;
    (d) intermediate frequency amplifier means for receiving said intermediate frequency signal and producing an amplified intermediate frequency signal; and,
    (e) second detector means for receiving said amplified intermediate frequency signal and producing a video output signal.

11. The tile of claim 10 further comprising means for supplying bias voltage to said intermediate frequency amplification means and said second detector means of respective of said plurality of monolithic superheterodyne detector pixels.

12. The tile of claim 11 further comprising means for extracting from respective of said plurality of monolithic superheterodyne detector pixels said video output signal produced by said second detector means.

* * * * *